United States Patent
Jung et al.

(10) Patent No.: US 9,418,008 B2
(45) Date of Patent: Aug. 16, 2016

(54) ELECTRONIC DEVICE WITH VARIABLE RESISTIVE PATTERNS

(71) Applicant: SK hynix Inc., Icheon (KR)

(72) Inventors: Kyoo-Ho Jung, Icheon (KR); Byung-Jick Cho, Icheon (KR); Jong-Chul Lee, Icheon (KR); Won-Ki Ju, Icheon (KR)

(73) Assignee: SK HYNIX INC., Icheon (KR)

( * ) Notice: Subject to any disclaimer, the term of this patent is extended or adjusted under 35 U.S.C. 154(b) by 64 days.

(21) Appl. No.: 14/523,802

(22) Filed: Oct. 24, 2014

(65) Prior Publication Data

US 2016/0005462 A1  Jan. 7, 2016

(30) Foreign Application Priority Data

Jul. 1, 2014 (KR) .................. 10-2014-0081769

(51) Int. Cl.
| | |
|---|---|
| *G06F 12/02* | (2006.01) |
| *G06F 13/00* | (2006.01) |
| *G06F 12/08* | (2016.01) |
| *G11C 13/00* | (2006.01) |

(52) U.S. Cl.
CPC .......... *G06F 12/0802* (2013.01); *G06F 12/023* (2013.01); *G11C 13/0021* (2013.01); *G06F 2212/1016* (2013.01); *G06F 2212/1036* (2013.01); *G06F 2212/202* (2013.01); *G06F 2212/222* (2013.01); *G06F 2212/251* (2013.01); *G11C 2213/52* (2013.01); *G11C 2213/77* (2013.01)

(58) Field of Classification Search
CPC .............. G06F 12/0802; G06F 12/023; G06F 2212/1016; G06F 2212/1036; G06F 2212/202; G06F 2212/222; G11C 13/0021; G11C 2213/52; G11C 2213/77
USPC .......................................... 711/104
See application file for complete search history.

(56) References Cited

U.S. PATENT DOCUMENTS

| | | | | |
|---|---|---|---|---|
| 8,916,847 B2 * | 12/2014 | Lee | .................. | H01L 45/04 257/3 |
| 9,118,003 B2 * | 8/2015 | Park | .................. | H01L 45/1253 |
| 2014/0021432 A1 * | 1/2014 | Lee | .................. | H01L 45/04 257/4 |
| 2014/0252299 A1 * | 9/2014 | Choi | .................. | H01L 45/1253 257/4 |
| 2015/0155482 A1 * | 6/2015 | Lee | .................. | H01L 45/12 711/154 |
| 2015/0162080 A1 * | 6/2015 | Song | .................. | G11C 13/0069 365/148 |
| 2015/0206585 A1 * | 7/2015 | Kim | .................. | H01L 45/141 711/103 |
| 2015/0214478 A1 * | 7/2015 | Lee | .................. | H01L 45/1233 257/5 |
| 2015/0293677 A1 * | 10/2015 | Fong | .................. | H04L 65/4084 715/717 |
| 2016/0043313 A1 * | 2/2016 | Lee | .................. | H01L 45/1675 711/104 |

FOREIGN PATENT DOCUMENTS

| | | | | |
|---|---|---|---|---|
| KR | 2009006436 A | * | 1/2009 | ............ H01L 37/115 |
| KR | 10-2013-0046641 A | | 5/2013 | |

* cited by examiner

*Primary Examiner* — Pierre-Michel Bataille (57) ABSTRACT

An electronic device includes a semiconductor memory unit. The semiconductor memory unit includes a plurality of first lines extending in a first direction, a plurality of second lines extending in a second direction intersecting the first direction, and a plurality of variable resistance patterns that is positioned at intersections of the first lines and the second lines and disposed between the first lines and the second lines in a vertical direction. Each of the variable resistance patterns has an elongated shape in a plan view and a portion of each of the variable resistance patterns is disposed outside a region in which a corresponding first line and a corresponding second line overlap with each other.

16 Claims, 9 Drawing Sheets

ELECTRONIC DEVICE WITH VARIABLE RESISTIVE PATTERNS

CROSS-REFERENCE TO RELATED APPLICATION

The present application claims priority of Korean Patent Application No. 10-2014-0081769, entitled "ELECTRONIC DEVICE" and filed on Jul. 1, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an area of a memory cell is secured and thereby an endurance characteristic and an operating characteristic is improved.

In one aspect, an electronic device includes a semiconductor memory unit that includes: a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an elongated shape and a portion of each of the variable resistance patterns is protruded toward an outside of a region where a corresponding first line and a corresponding second line overlap with each other.

Implementations of the above device may include one or more of the following.

A direction of a major axis of each of the variable resistance patterns intersects with the first and second directions. When a third direction intersects with the first and second directions and an angle between the third direction and the first direction is substantially same as an angle between the third direction and the second direction, the direction of the major axis is parallel to the third direction. The first direction and the second direction are substantially perpendicular to each other, and each of the angle between the third direction and the first direction and the angle between the third direction and the second direction is about 45 degrees. Major axes of the variable resistance patterns which are arrayed in the third direction are aligned with a straight line which is extended in the third direction. When a third direction intersects with the first and second directions and an angle between the third direction and the first direction is substantially same as an angle between the third direction and the second direction, the direction of the major axis is not parallel to the third direction. The first direction and the second direction are substantially perpendicular to each other, an angle between the direction of the major axis and the first direction is about 30 degrees, and an angle between the direction of the major axis and the second direction is about 60 degrees. Major axes of the variable resistance patterns which are arrayed in the third direction are not aligned with a straight line which is extended in the third direction. The variable resistance patterns include a material of which a resistance is changed by generation or disappearance of a filament current path. The semiconductor memory unit further comprises: a selection element which is interposed between each of the variable resistance patterns and the corresponding first line or between each of the variable resistance patterns and the corresponding second line. The elongated shape includes an oval shape The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

These and other aspects, implementations and associated advantages are described in greater detail in the drawings, the description and the claims.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1A:
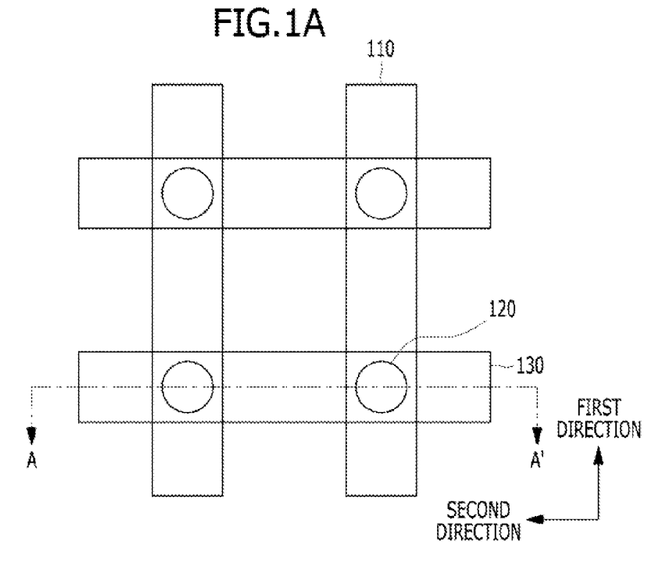
FIG. 1A is a plan view showing a semiconductor device.
Figure 1B:
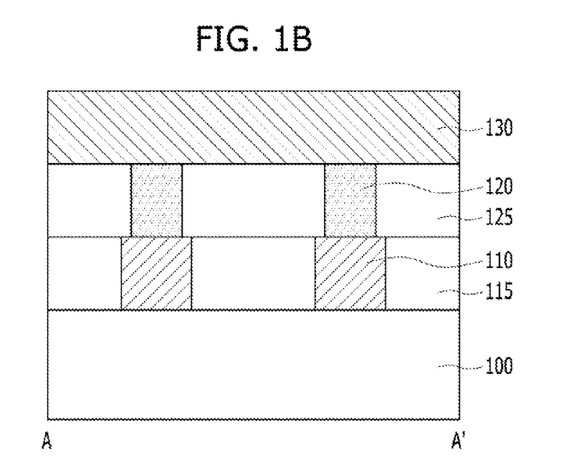
FIG. 1B is a cross-sectional view taken along a line A-A' of FIG. 1A.
Figure 1C:
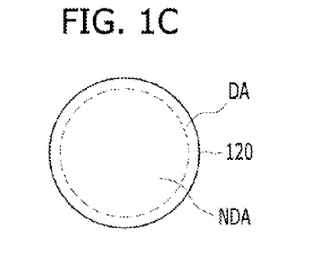
FIG. 1C is a plan view showing a variable resistance pattern of FIG. 1A.

FIG. 1A is a plan view showing a semiconductor device, FIG. 1B is a cross-sectional view taken along a line A-A' of FIG. 1A, and FIG. 1C is a plan view showing a variable resistance pattern of FIG. 1A.

Referring to FIGS. 1A to 1C, the semiconductor device includes a substrate 100 in which elements (not shown) are formed, a plurality of lower lines 110, a plurality of upper lines 130, and a plurality of variable resistance patterns 120. The plurality of lower lines 110 is disposed over the substrate 100 and extends in a first direction that is parallel to a surface of the substrate 100. The plurality of upper lines 130 is disposed over the lower lines 110 and extends in a second direction that is parallel to the surface of the substrate 100 and intersects the first direction. The plurality of variable resistance patterns 120 is disposed at intersections of the lower lines 110 and the upper lines 130 and is disposed between the lower lines 110 and the upper lines 130 in a direction that is perpendicular to the first and second directions, e.g., in a vertical direction.

The lower line 110 and the upper line 130 may be coupled to a bottom surface and a top surface of the variable resistance pattern 120, respectively, and supply a required voltage or current to the variable resistance pattern 120.

The variable resistance pattern 120 may include a material that switches between different resistance states according to the supplied voltage or current. The variable resistance pattern 120 serves as a memory cell storing different data corresponding to the different resistance states. The variable resistance pattern 120 may have an island configuration at a corresponding one of the intersections of the lower lines 110 and the upper lines 130. As a result, the variable resistance patterns 120 positioned at the intersections are separate from each other. Referring to FIG. 1A, the variable resistance pattern 120 has a circular shape in a plan view and is disposed in a region in which the lower line 110 and the upper line 130 overlap with each other.

The variable resistance pattern 120 may include a metal oxide containing oxygen vacancies. A resistance state of the variable resistance pattern 120 may be changed based on whether a filament current path is generated or disappears in the variable resistance pattern 120, according to the movement of the oxygen vacancies. That is, when the filament current path is generated in the variable resistance pattern 120, the variable resistance pattern 120 may be in a low resistance state and store data '0'. On the other hand, when the filament current path disappears in the variable resistance pattern 120, the variable resistance pattern 120 may be in a high resistance state and store data '1'.

Referring to FIG. 1B, space between the lower lines 110 is filled with a first interlayer dielectric layer 115, and space between the variable resistance patterns 120 is filled with a second interlayer dielectric layer 125. Space between the upper lines 130 is filled with a third interlayer dielectric layer (not shown).

The lower lines 110 and the upper lines 130 may be formed by depositing a conductive material and selectively etching the conductive material. The variable resistance patterns 120 may be formed by depositing a variable resistance material and patterning the variable resistance material.

However, in the semiconductor device shown in FIGS. 1A to 1C, since the variable resistance pattern 120 is formed in a small area corresponding to an intersection region of a lower line 110 and an upper line 130, an initial resistance value of the variable resistance pattern 120 is high and the number of filaments, which are generated in the variable resistance pattern 120 to form the filament current path, is small. In this case, if a high current is applied to a memory cell, a breakdown of the memory cell may occur.

Also, the endurance of the memory cell may be deteriorated. An effective area of the variable resistance pattern 120 is gradually reduced as the number of times write operations performed in the memory cell increases. The endurance of the memory cell may be improved if the variable resistance pattern 120 is formed to have a large area. However, as described above, the variable resistance pattern 120 is formed in a small area. Here, the effective area of the variable resistance pattern 120 represents an area in which the filament current path is actually generated or disappears.

Furthermore, a sidewall of the variable resistance pattern 120 may be damaged by an etching process. In FIG. 1C, a damaged area of the sidewall of the variable resistance pattern 120 is represented by 'DA', and a non-damaged area of the variable resistance pattern 120 is represented by 'NDA'. Since the sidewall of the variable resistance pattern 120 is damaged, the effective area of the variable resistance pattern 120 may be further reduced. As a result, a breakdown of the memory cell may occur, and the endurance of the memory cell may be deteriorated.

In embodiments of the present disclosure, the drawbacks of the semiconductor device shown in FIGS. 1A to 1C may be solved by increasing an area of a memory cell. This will be described in more detail with reference to FIGS. 2A to 4.

Figure 2A:
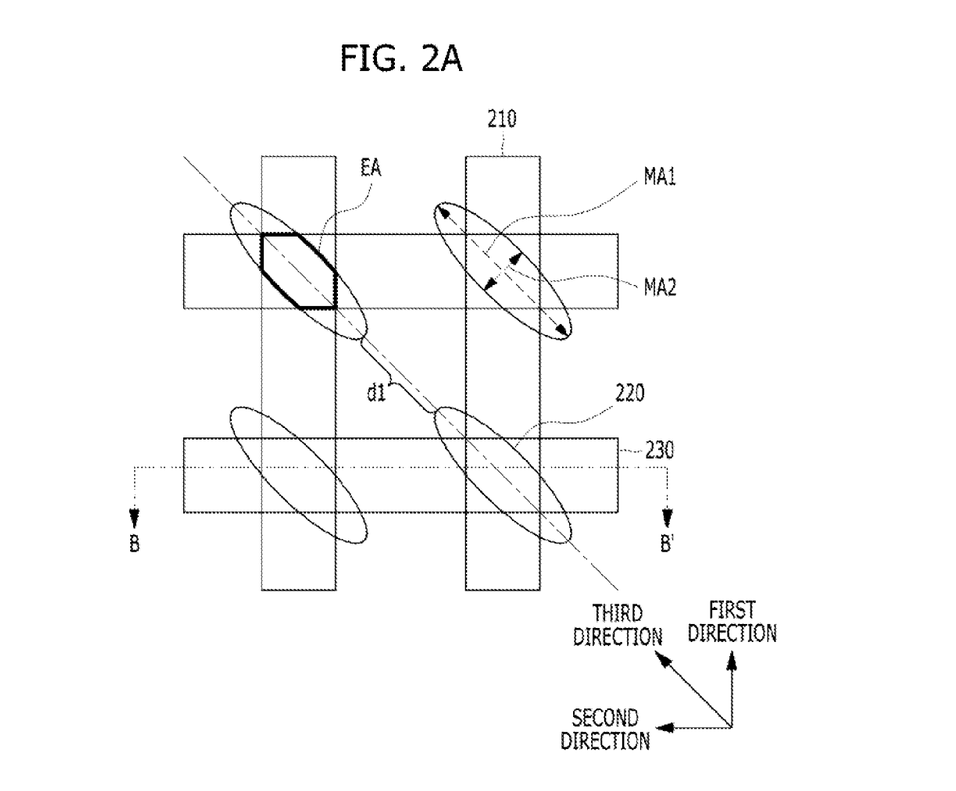
FIG. 2A is a plan view showing a semiconductor device in accordance with an embodiment of the present disclosure.
Figure 2B:
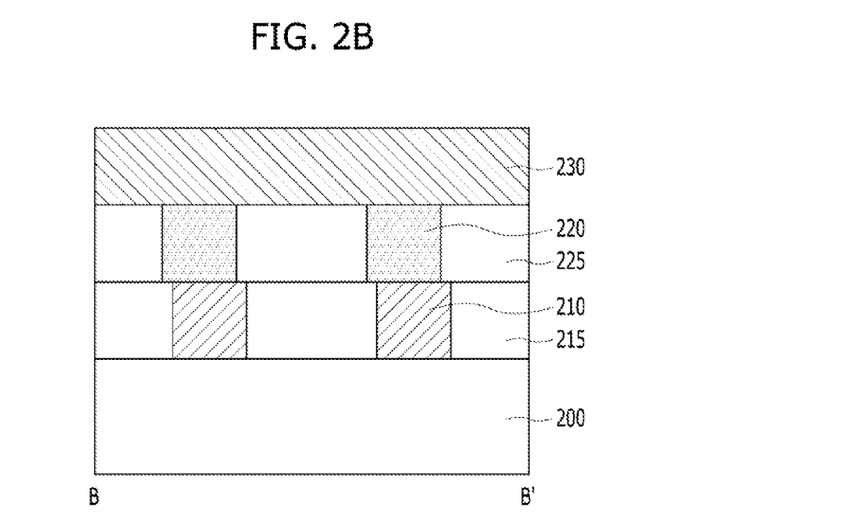
FIG. 2B is a cross-sectional view taken along a line B-B' of FIG. 2A.
Figure 2C:
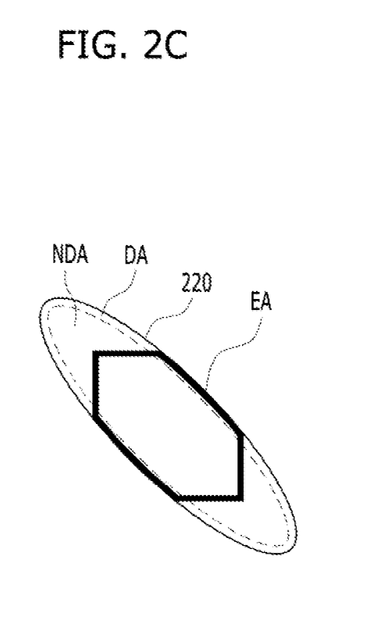
FIG. 2C is a plan view showing a variable resistance pattern of FIG. 2A.

FIG. 2A is a plan view showing a semiconductor device in accordance with an embodiment of the present disclosure, FIG. 2B is a cross-sectional view taken along a line B-B' of FIG. 2A, and FIG. 2C is a plan view showing a variable resistance pattern of FIG. 2A.

Referring to FIGS. 2A to 2C, the semiconductor device includes a substrate 200 in which device elements (not shown) are formed, a plurality of lower lines 210, a plurality of upper lines 230, and a plurality of variable resistance patterns 220. The plurality of lower lines 210 is disposed over the substrate 200 and extends in a first direction that is parallel to a surface of the substrate 200. The plurality of upper lines 230 is disposed over the lower lines 210 and extends in a second direction that is parallel to the surface of the substrate 200 and intersects the first direction. The plurality of variable resistance patterns 220 is positioned at intersections of the lower lines 210 and the upper lines 230 and disposed between the lower lines 210 and the upper lines 230 in a direction that is perpendicular to the first and second directions, e.g., in a vertical direction.

The lower line 210 and the upper line 230 may supply a voltage or current to the variable resistance pattern 220. The lower line 210 and the upper line 230 may be formed of a single-layered structure or a multi-layered structure and include one or more of various conductive materials such as a metal, a metal nitride, and the like.

The variable resistance pattern 220 may be formed of a single-layered structure or a multi-layered structure and include a metal oxide containing oxygen vacancies. The metal oxide may be an oxygen-deficient metal oxide, which is deficient in oxygen compared to an oxygen-rich metal oxide that satisfies a stoichiometric ratio. In some embodiments, the oxygen-deficient metal oxide may be any of $TiO_x$ (x<2), $TaO_y$ (y<2.5), etc. A resistance state of the variable resistance pattern 220 may be changed based on whether a filament current path is generated or disappears in the variable resistance pattern 220 according to movement of the oxygen vacancies.

In an embodiment, the variable resistance pattern 220 has a double-layered structure in which an oxygen-deficient metal oxide layer and an oxygen-rich metal oxide layer are stacked in a vertical direction. In another embodiment, positions of the oxygen-deficient metal oxide layer and the oxygen-rich metal oxide layer may be reversed. The oxygen-rich metal oxide layer may include a material that satisfies a stoichiometric ratio, such as $TiO_2$ or $Ta_2O_5$. The oxygen-deficient metal oxide layer may include a material that is deficient in oxygen compared to a material that satisfies a stoichiometric ratio. The resistance state of the variable resistance pattern 220 may change from a high resistance state and a low resistance state based on whether or not oxygen vacancies of the oxygen-deficient metal oxide layer move to the oxygen-rich metal oxide layer and thus generate a filament current path in the oxygen-rich metal oxide layer.

As shown in FIG. 2A, the variable resistance pattern 220 may have an elongated shape such as an oval shape in a plan view. Although an oval shape is shown for convenience of description, embodiments are not limited thereto. In other embodiments, the variable resistance pattern may have another elongated shape in which a width in a first direction of the shape is greater than a width in a second direction that is perpendicular to the first direction. The oval shape has a major axis MA1 and a minor axis MA2. A direction of the major axis MA1 may intersect the first direction and the second direction and thus may be slanted with respect to the first direction and the second direction. In an embodiment, if a third direction extends through the middle of the angle formed by the first direction and the second direction, that is, an acute angle between the third direction and the first direction is substantially the same as an acute angle between the third direction and the second direction, the direction of the major axis MA1 is parallel to the third direction. Therefore, major axes MA1 of the variable resistance patterns 220, which are arrayed in the third direction, may be aligned with a straight line that extends in the third direction. In an embodiment, if the first direction and the second direction are substantially perpendicular to each other, the acute angle between the third direction and the first direction is about 45 degrees and the acute angle between the third direction and the second direction is about 45 degrees.

Referring to FIG. 2A, since the variable resistance pattern 220 has an oval shape and the major axis MA1 of the variable resistance pattern 220 is slanted with respect to the first direction and the second direction, only a portion of the variable resistance pattern 220 overlaps with a region in which the lower line 210 and the upper line 230 overlap with each other. Hereinafter, the region in which the lower line 210 and the upper line 230 overlap with each other is referred to as an overlapping region. Accordingly, the variable resistance pattern 220 has some outer portions that extend outside the overlapping region. The portion of the variable resistance pattern 220 that overlaps with the overlapping region is represented by a bold line in FIGS. 2A and 2C. This portion serves as an effective area EA of the variable resistance pattern 220. This is because the variable resistance pattern 220 is supplied with a voltage or current only in the overlapping region thereby changing the resistance state of the variable resistance pattern 220 in the overlapping region.

A method of fabricating the semiconductor device shown in FIGS. 2A to 2C will be described hereinafter.

The lower lines 210 may be formed by depositing a conductive material over the substrate 200 and selectively etching the conductive material. Then, a first interlayer dielectric layer 215 may be formed to fill the space between the lower lines 210. The first interlayer dielectric layer 215 may be formed by depositing an insulating material to cover the substrate 200 and the lower lines 210 and performing a planarization process on the insulating material until top surfaces of the lower lines 210 are exposed.

Subsequently, the variable resistance patterns 220 may be formed by depositing a variable resistance material over the lower lines 210 and the first interlayer dielectric layer 215 and patterning the variable resistance material. After that, a second interlayer dielectric layer 225 may be formed to fill the space between the variable resistance patterns 220. The patterning of the variable resistance material may be performed using a mask pattern that has a shape of which a width in one direction is larger than a width in another direction, for example, an oval shape, a diamond shape, or the like. The upper lines 230 may be formed by depositing a conductive material over the variable resistance patterns 220 and the second interlayer dielectric layer 225 and selectively etching the conductive material. A third interlayer dielectric layer (not shown) may be formed to fill the space between the upper lines 230.

In the semiconductor device shown in FIGS. 2A to 2C, the variable resistance pattern 220 has an oval shape so that some outer portions of the variable resistance pattern 220 extend outside an overlapping region in which the lower line 210 and the upper line 230 overlap with each other. As a result, the effective area EA of the variable resistance pattern 220, which also includes a portion overlapping with an edge portion of the overlapping region, may be increased compared to the effective area of the variable resistance pattern 120 shown in FIG. 1A, which does not include a portion overlapping with the edge portion of the overlapping region. Accordingly, the number of filaments in a filament current path generated in the variable resistance pattern 220 may be increased. As a result, although a high current is applied to a memory cell, the possibility that the breakdown of the memory cell occurs may be reduced and the endurance of the memory cell may be improved.

Furthermore, if a major axis MA1 of a variable resistance pattern is parallel to the first direction or the second direction, a distance between adjacent variable resistance patterns in the first direction or the second direction is small. As a result, an electrical short may occur between the adjacent variable resistance patterns. However, in the embodiment shown in FIGS. 2A to 2C, since the major axis MA1 of the variable resistance pattern 220 is slanted with respect to the lower line 210 and the upper line 230, a distance between adjacent variable resistance patterns 220 in the first direction, the second direction, and the third direction may be increased properly. As a result, the likelihood of an electrical short occurring between the adjacent variable resistance patterns 220 may be reduced.

In addition, even if a sidewall of the variable resistance pattern 220 is damaged by an etching process, a damaged area included in the effective area EA of the variable resistance pattern 220 may be smaller than a damaged area DA included in an effective area of the variable resistance pattern 120 shown in FIG. 1C. This is because only a portion of the damaged area DA is included in the effective area EA in the embodiment of FIGS. 2A to 2C, as shown in FIG. 2C, while the whole damaged area DA is included in the effective area in FIG. 1C.

In the above embodiment, the major axis MA1 of the variable resistance pattern 220 is parallel to the third direction that extends through the middle of the angle between the first direction and the second direction, and thus the major axis MA1 of the variable resistance pattern 220 is aligned with a straight line that extends in the third direction. However, embodiments are not limited thereto. The direction of the major axis MA1 intersecting the first and second directions may make various angles with the first direction or the second direction. This will be described with reference to FIGS. 3A and 3B.

Figure 3A:
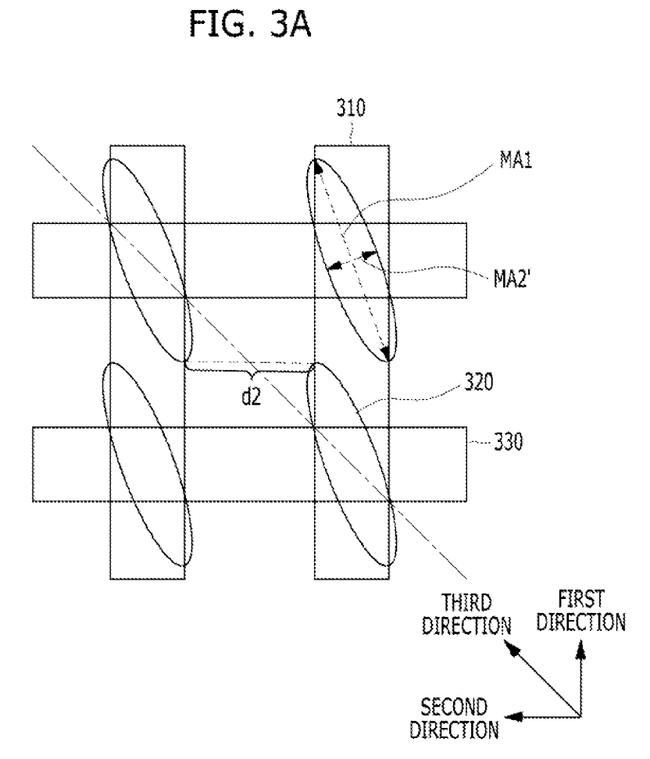
FIG. 3A is a plan view showing a semiconductor device in accordance with another embodiment of the present disclosure.
Figure 3B:
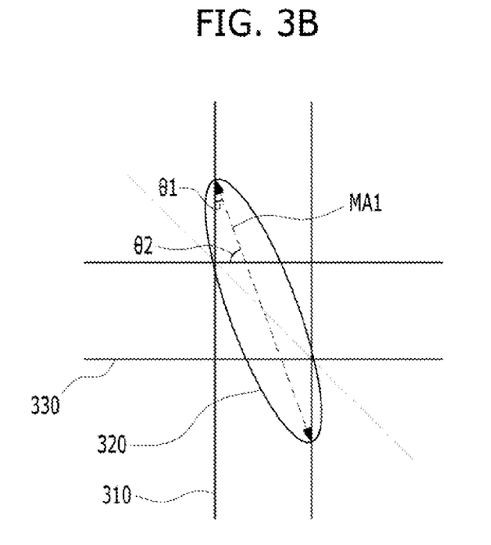
FIG. 3B is a plan view showing a variable resistance pattern of FIG. 3A.

FIG. 3A is a plan view showing a semiconductor device in accordance with another embodiment of the present disclosure, and FIG. 3B is a plan view showing a variable resistance pattern of FIG. 3A.

Referring to FIGS. 3A and 3B, variable resistance patterns 320 are positioned at intersections of lower lines 310, which extend in a first direction, and upper lines 330, which extend in a second direction intersecting the first direction. The variable resistance pattern 320 has an oval shape, which has a major axis MA1 and a minor axis MA2, in a plan view. Here, if a third direction extends through the middle of the angle between the intersecting first direction and second direction, the major axis MA1 of the variable resistance pattern 320 may intersect the first and second directions, but may not be parallel to the third direction. In this embodiment, major axes MA1 of the variable resistance patterns 320, which are arrayed in the third direction, may not be aligned with a straight line extending in the third direction.

Referring to FIG. 3B, when an acute angle between the major axis MA1 and the lower line 310 is represented by 'θ1' and an acute angle between the major axis MA1 and the upper line 330 is represented by 'θ2', the angle θ1 is different from the angle θ2. In an embodiment, if the first direction and the second direction are substantially perpendicular to each other, the angle θ1 may be about 30 degrees and the angle θ2 may be about 60 degrees, or vice versa. As a result, in the embodiment shown in FIG. 3A, a distance d2 between adjacent variable resistance patterns 320 in the third direction may be increased compared to the embodiment shown in FIG. 2A. However, embodiments are not limited thereto. An angle between the major axis MA1 and the first direction or between the major axis MA1 and the second direction may be modulated in various ways in order to obtain a proper distance between adjacent variable resistance patterns 320 in the first direction, the second direction, and/or the third direction.

In another embodiment, a selection element may be further provided between the variable resistance pattern 220 or 320 and the lower line 210 or 310 or between the variable resistance pattern 220 or 320 and the upper line 230 or 330, in order to reduce a sneak current that can be generated in a semiconductor device having a cross-point structure. An embodiment including a selection element will be described with reference to FIG. 4.

Figure 4:
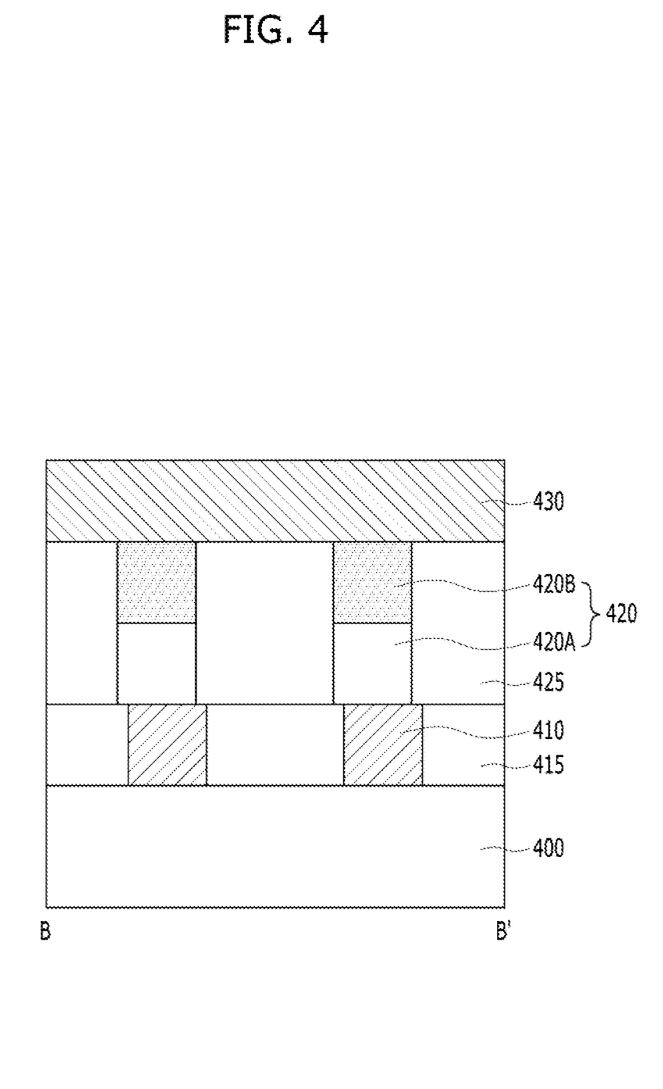
FIG. 4 is a cross-sectional view showing a semiconductor device in accordance with still another embodiment of the present disclosure

FIG. 4 is a cross-sectional view showing a semiconductor device in accordance with still another embodiment of the present disclosure.

Referring to FIG. 4, a stacked structure 420 in which a selection element 420A and a variable resistance pattern 420B are stacked is positioned at each of intersections of lower lines 410 extending in a first direction and upper lines 430 disposed over the lower lines 410 and extending in a second direction intersecting the first direction. The first direction and the second direction may be parallel to a surface of the semiconductor substrate 400. The stacked structure 420 is disposed between the lower lines 410 and the upper lines 430 in a direction that is perpendicular to the first and second directions, e.g., in a vertical direction. The variable resistance pattern 420B may have substantially the same shape in a plan view as the variable resistance pattern 220 or 320.

The selection element 420A may control access to the variable resistance pattern 420B. The selection element 420A may have a non-linear current-voltage characteristic, thereby preventing a current from flowing when a voltage level of a voltage applied thereto is below a predetermined threshold voltage level, and allowing a current to flow when the voltage level is equal to or higher than the predetermined threshold voltage level. The selection element 420A may include any of a diode, a transistor, a varistor, an MIT (Metal-Insulator Transition) element, a tunneling barrier formed of an insulating material, and the like.

The selection element 420A may be patterned together with the variable resistance pattern 420B. Therefore, the selection element 420A and the variable resistance pattern 420B may be vertically aligned and completely overlap with each other in a plan view, and the selection element 420A may have substantially the same shape in a plan view as the variable resistance pattern 420B. That is, the selection element 420A and the variable resistance pattern 420B may both have an oval shape, and a portion of the selection element 420A extends outside a region in which the lower line 410 and the upper line 430 overlap with each other. Further, a major axis of the selection element 420A may be slanted with respect to the lower line 410 and the upper line 430.

The above and other memory circuits or semiconductor devices based on the disclosed technology can be used in a range of devices or systems. FIGS. 5-9 provide some examples of devices or systems that can implement the memory circuits disclosed herein.

Figure 5:
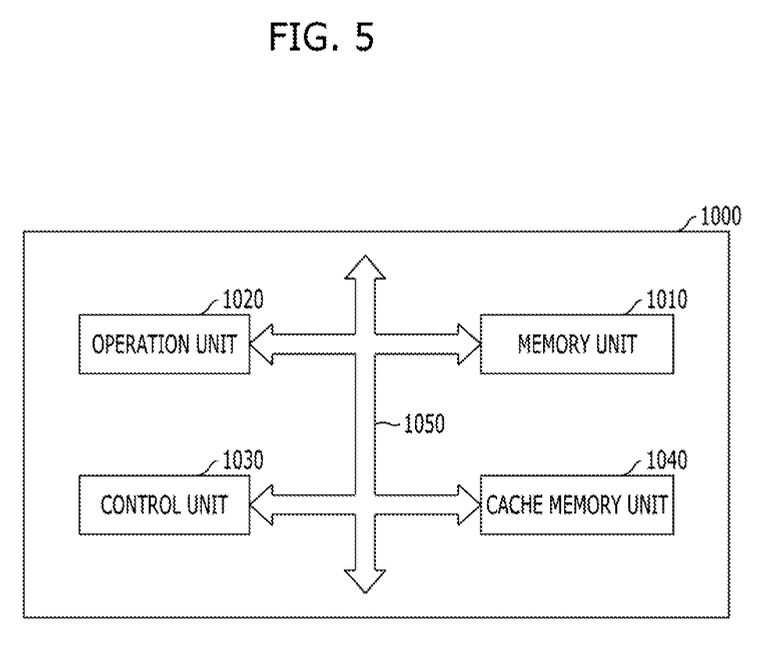
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing the operations are stored.

The memory unit 1010 may include one or more of the above-described semiconductor devices in accordance with the implementations. For example, the memory unit 1010 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
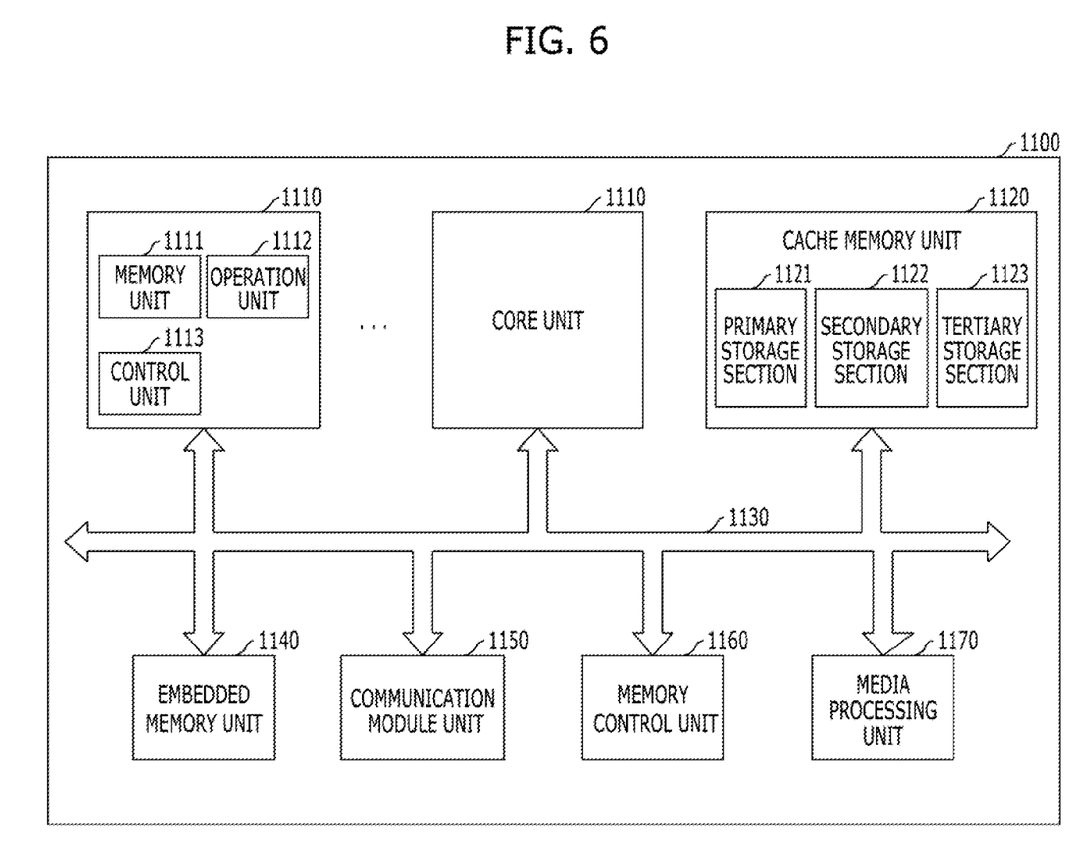
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the cache memory unit 1120 may be improved. As a consequence, performance characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
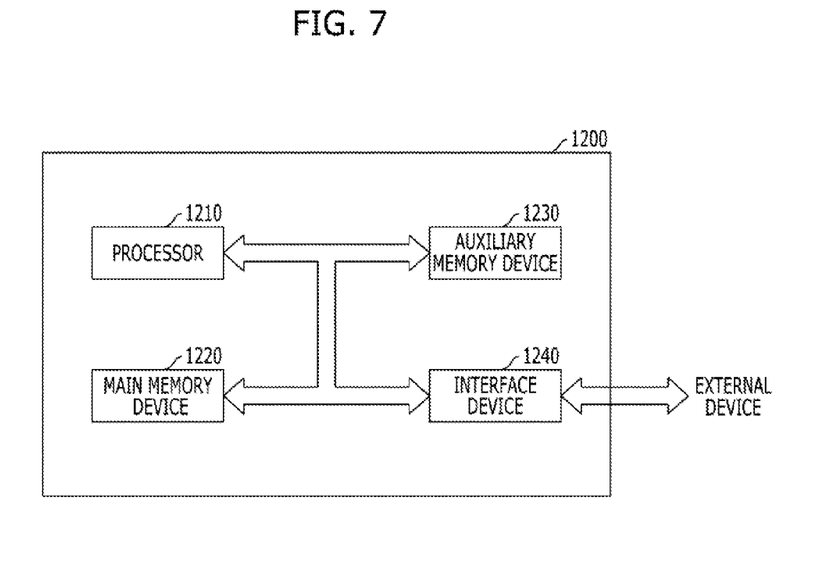
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
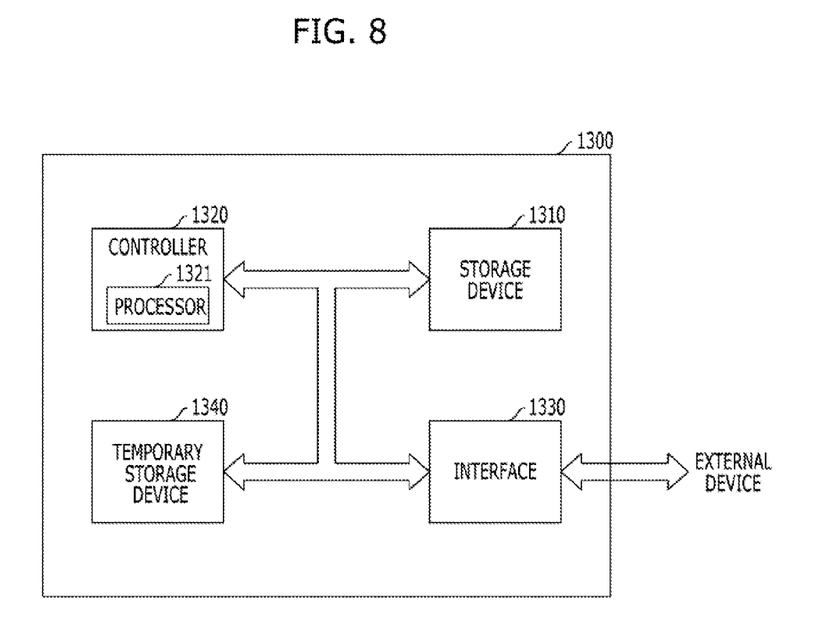
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the temporary storage device 1340 may be improved. As a consequence, performance characteristics of the data storage system 1300 may be improved.

Figure 9:
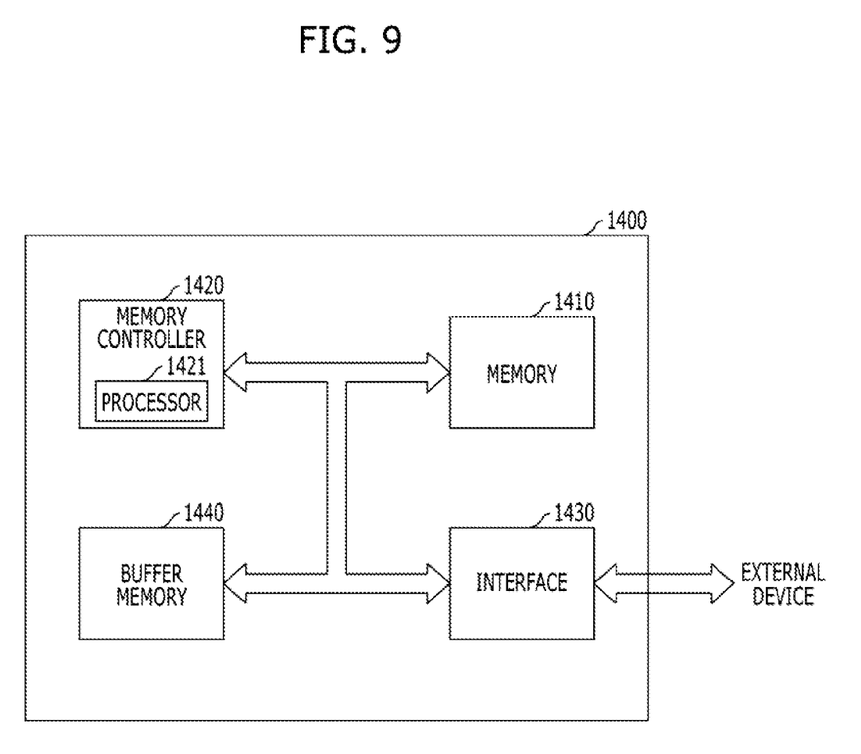
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the memory 1410 may be improved. As a consequence, performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first lines which are extended in a first direction; a plurality of second lines which are extended in a second direction intersecting with the first direction; and a plurality of variable resistance patterns which are positioned at intersections of the first lines and the second lines between the first lines and the second lines, wherein each of the variable resistance patterns has an oval shape and a portion of each of the variable resistance patterns is protruded toward an outside of a region where a corresponding first line and a corresponding second line overlap with each other. Through this, endurance and performance characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit, wherein the semiconductor memory unit comprises:
   a plurality of first lines extending in a first direction;
   a plurality of second lines extending in a second direction intersecting the first direction; and
   a plurality of variable resistance patterns positioned at intersections of the first lines and the second lines and disposed between the first lines and the second lines in a direction that is perpendicular to the first and second directions,
   wherein each of the variable resistance patterns has an elongated shape in a plan view and a portion of each of the variable resistance patterns extends outside a region in which a corresponding first line and a corresponding second line overlap with each other,
   wherein each of the variable resistance patterns overlaps with each of the intersections of the first lines and the second lines so that there is a one-to-one correspondence between the variable resistance patterns and the intersections of the first lines and the second lines, and
   wherein, in a direction of a major axis of each of the variable resistance patterns, two adjacent variable resistance patterns are spaced apart from each other.

2. The electronic device according to claim 1, wherein the direction of the major axis intersects the first and second directions.

3. The electronic device according to claim 2, wherein, when a third direction intersects the first and second directions and an angle between the third direction and the first direction is substantially the same as an angle between the third direction and the second direction, the direction of the major axis is parallel to the third direction.

4. The electronic device according to claim 3, wherein the first direction and the second direction are substantially perpendicular to each other, and each of the angle between the third direction and the first direction and the angle between the third direction and the second direction is about 45 degrees.

5. The electronic device according to claim 3, wherein major axes of the variable resistance patterns arrayed in the third direction are aligned with a straight line extending in the third direction.

6. The electronic device according to claim 2, wherein, when a third direction intersects the first and second directions and an angle between the third direction and the first direction is substantially the same as an angle between the third direction and the second direction, the direction of the major axis is not parallel to the third direction.

7. The electronic device according to claim 6, wherein the first direction and the second direction are substantially perpendicular to each other, an angle between the direction of the major axis and the first direction is about 30 degrees, and an angle between the direction of the major axis and the second direction is about 60 degrees.

8. The electronic device according to claim 6, wherein major axes of the variable resistance patterns arrayed in the third direction are not aligned with a straight line extending in the third direction.

9. The electronic device according to claim 1, wherein the variable resistance patterns include a material having a resistance state that changes according to whether a filament current path is generated or disappears therein.

10. The electronic device according to claim 1, wherein the semiconductor memory unit further comprises:
a selection element interposed between each of the variable resistance patterns and a corresponding first line or between each of the variable resistance patterns and a corresponding second line.

11. The electronic device according to claim 1, wherein the elongated shape includes an oval shape.

12. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is a part of the memory unit in the microprocessor.

13. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is a part of the cache memory unit in the processor.

14. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is a part of the auxiliary memory device or the main memory device in the processing system.

15. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is a part of the storage device or the temporary storage device in the data storage system.

16. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit is a part of the memory or the buffer memory in the memory system.

* * * * *